United States Patent
Kawata et al.

(10) Patent No.: US 6,657,207 B2
(45) Date of Patent: Dec. 2, 2003

(54) CHARGED-PARTICLE-BEAM MICROLITHOGRAPHY APPARATUS AND METHODS INCLUDING OPTICAL CORRECTIONS MADE DURING SUBFIELD EXPOSURES

(75) Inventors: Shintaro Kawata, Mariya (JP); Teruaki Okino, Kamakura (JP); Kazuaki Suzuki, Tokyo (JP); Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 124 days.

(21) Appl. No.: 09/805,732

(22) Filed: Mar. 13, 2001

(65) Prior Publication Data
US 2001/0052579 A1 Dec. 20, 2001

(30) Foreign Application Priority Data
Mar. 15, 2000 (JP) ......... 2000-118767

(51) Int. Cl.[7] ............ G21G 5/00; G21K 5/10
(52) U.S. Cl. ............ 250/492.2; 250/492.1; 250/492.22; 250/492.23
(58) Field of Search ............ 250/492.2, 492.21, 250/492.22, 492.23

(56) References Cited

U.S. PATENT DOCUMENTS

| | | | |
|---|---|---|---|
| 4,698,509 A | * 10/1987 | Wells et al. | 250/492.2 |
| 5,404,019 A | * 4/1995 | Ohno et al. | 250/492.23 |
| 6,151,101 A | * 11/2000 | Okino | 355/53 |
| 6,222,197 B1 | * 4/2001 | Kojima | 250/492.22 |

OTHER PUBLICATIONS

Berger et al., "Particle–particle interaction effects in image projection lithography systems," *J. Vac. Sci. Technol. B* 11(6): 2294–2298, Nov./Dec. 1993.

* cited by examiner

Primary Examiner—John R. Lee
Assistant Examiner—Paul M. Gurzo
(74) Attorney, Agent, or Firm—Klarquist Sparkman, LLP

(57) ABSTRACT

Charged-particle-beam (CPB) apparatus and methods are disclosed that achieve efficient correction of imaging conditions such as shape-astigmatic aberrations, etc., caused by differences in the distribution of pattern elements within respective subfields of the reticle. Indices based on the pattern-element distributions within subfields are stored, together with corresponding optical-correction data for the subfields. As the subfields are exposed, respective data are recalled and the exposure is performed with optical corrections made according to the data. The indices are determined beforehand from pattern data at time of reticle manufacture. The tabulated data are rewritable with changes in apparatus parameters such as beam-current density and beam-divergence angle. Intermediate data can be determined by interpolation of tabulated data.

18 Claims, 2 Drawing Sheets

CHARGED-PARTICLE-BEAM MICROLITHOGRAPHY APPARATUS AND METHODS INCLUDING OPTICAL CORRECTIONS MADE DURING SUBFIELD EXPOSURES

FIELD OF THE INVENTION

This invention pertains to microlithography (projection-transfer of a pattern, defined on a reticle or mask, to a "sensitive" substrate using an energy beam). Microlithography is a key technology employed in the fabrication of microelectronic devices such as integrated circuits, displays, magnetic pickup heads, and micromachines. More specifically, the invention pertains to microlithography performed using a charged particle beam (e.g., electron beam or ion beam) as the energy beam. Even more specifically, the invention pertains to altering the focusing conditions to realize with good efficiency the correction of shape defects in transfer images caused by differences in the pattern distribution within respective subfields and manufacturing error at the time of mask preparation, and thus to realize high-resolution, high-precision pattern transfer and exposure, in a charged-particle-beam exposure method using a so-called divided-reticle transfer system.

BACKGROUND OF THE INVENTION

The prior art is discussed in the context of using an electron beam to perform microlithography of a complex pattern, such as for a layer of an integrated circuit, onto the surface of a suitable substrate such as a semiconductor wafer. Electron-beam microlithography offers prospects of very high accuracy and pattern resolution, but to date the throughput realized using electron-beam microlithography has been disappointingly low. Various approaches have been investigated to solve the low-throughput problem.

Example approaches currently being utilized to a limited extent include "cell projection," "character projection," and "block exposure" (collectively termed "partial-block" pattern transfer). Partial-block pattern transfer is used especially whenever the pattern to be transferred to the substrate comprises a region in which a basic pattern unit (or several basic pattern units) is repeated many times. For example, partial-block pattern transfer generally is used for patterns having large memory circuits, such as DRAMs. In such patterns, the basic pattern units are very small, having measurements on the substrate of, for example $(5 \,\mu m)^2$ (i.e., $5 \,\mu m \times 5 \,\mu m$). The basic pattern units are defined on one or several exposure units on the reticle and the exposure units are exposed repeatedly many times onto the substrate to form the pattern on the substrate. Unfortunately, partial-block pattern transfer tends to be employed only for repeated portions of the pattern. Portions of the pattern that are not repeated are transferred onto the substrate using a different method, such as the variable-shaped beam method. Therefore, partial-block pattern transfer has a throughput that is too low, especially for large-scale production of integrated circuits and other microelectronic devices.

Another approach is electron-beam "direct writing" in which the pattern is drawn on the substrate line by line. Whereas this approach has application in preparing reticles and masks, the throughput obtained with this technique is much too low to be practical for large-scale production of integrated circuits and other microelectronic devices. During such direct writing, the shape of the beam can be changed (termed "variable-shaped beam" pattern transfer).

Yet another conventional approach that has been investigated in an effort to achieve a higher throughput than partial-block pattern-transfer methods is a projection microlithography method in which the entire reticle pattern for a complete die (or even multiple dies) is projection-exposed onto the substrate in a single "shot." In such a method, the reticle defines a complete pattern, such as for a particular layer in an entire integrated circuit. The image of the reticle pattern as formed on the substrate is "demagnified" by which is meant that the image is smaller than the pattern on the reticle by a "demagnification factor" (typically 4:1 or 5:1). To form the image on the substrate, a projection lens is situated between the reticle and the substrate. Whereas this approach offers prospects of excellent throughput, it to date has exhibited excessive aberrations and the like, especially of peripheral regions of the projected pattern. In addition, it is extremely difficult to manufacture a reticle defining an entire pattern that can be exposed in one shot.

Yet another approach that is receiving much current attention is the "divided-reticle" projection-exposure approach that utilizes a "divided," "partitioned," or "segmented" reticle. On such a reticle, the overall reticle pattern is subdivided into portions termed herein "exposure units." The exposure units can be of any of various types termed "subfields," "stripes," etc., as known in the art. For exposure, the reticle is mounted on a reticle stage and the substrate is mounted on a substrate stage. Each exposure unit is exposed individually and sequentially in a separate "shot" or scan. The image of each exposure unit is projection-exposed (typically at a demagnification ratio such as 4:1 or 5:1) using a projection-optical system situated between the reticle and the substrate. Even though the projection-optical system typically has a large field, distortions, focal-point errors, and other aberrations, and other faults in projected images of the exposure units are generally well-controlled. Although divided-reticle projection-exposure systems provide lower throughput than systems that expose the entire reticle in one shot, divided-reticle projection-exposure systems exhibit better exposure accuracy and image resolution over the entire pattern as projected.

Further regarding divided-reticle projection-exposure systems, exposure of each exposure unit generally is performed with the focal point of the projected image on the surface of the substrate. Also, as each exposure unit is projected onto the substrate, aberrations such as distortion are corrected. The respective images of the exposure units are formed at corresponding locations on the substrate such that the images are "stitched" together in a contiguous manner. Such stitching usually is performed by a combination of stage movements and beam deflection.

In divided-reticle projection-transfer using a charged particle beam, despite the control that conventionally can be exerted during projection of each exposure unit, certain problems nevertheless can arise. For example, if the beam current of the charged particle beam used to form the image is excessively large, then imaging can be affected adversely due to mutual repulsion of the charged particles in the beam. This phenomenon is termed the "Coulomb effect." Also, the quality of imaging from one exposure unit to the next can be inconsistent, based upon changes in "feature density" or "feature distribution" from one exposure unit to another. Conventionally, changes can be made in real time to any of various imaging parameters to correct most of these changes. To such end, a modern charged-particle-beam (CPB) microlithography apparatus has a complex system for making subtle corrections to the optical performance of the system as exposure progresses. For example, in a modern variable-shaped beam system, focus correction can be predicted from the transverse area of the shaped beam and from other apparatus parameters such as acceleration voltage, beam-current density, beam-divergence angle, and axial length of the CPB-optical system.

In a conventional divided-reticle CPB-microlithography system, the dimensions of each exposure unit on the reticle range from approximately 10-$\mu$m square to 1000-$\mu$m square. (This area is extremely large compared to the area exposed per shot in any of the partial-block or variable-shaped beam approaches.) It has been reported that, in cases in which the area of the image is in this range, variations in imaging properties due to the Coulomb effect is small. See, Berger et al., "Particle-particle Interaction in Image Projection Lithography," *J Vac. Sci. Technol.* B11(6):2294, November/December 1993. According to conventional thinking, this allows the upper limit of beam current (at which the magnitude of variations in image properties can be kept below a specified threshold) to be increased so as to increase throughput.

In general, a reticle pattern is not distributed uniformly over each exposure unit. Rather, especially for complex patterns, the pattern is distributed over the reticle in a non-uniform manner. As a result, the manner in which image properties vary differs according to the pattern distribution. Such variations in image properties include variations in astigmatism, image focus, image rotation, image magnification, and image position for each exposure unit.

Also, errors arising at the time of reticle manufacture (e.g., errors arising during electron-beam drawing of the reticle and during subsequent etching of the pattern into the reticle substrate) cannot be predicted and corrected at the time the reticle pattern is designed. For example, errors can arise from deviations from specifications occurring during manufacture of the reticle from the pattern-design data. This would not be a problem if ideal manufacture of reticles were possible. However, since reticle manufacture remains an imperfect craft, corrections are required to correct or compensate for such errors, especially if maximal resolution must be achieved of the pattern as projected.

SUMMARY OF THE INVENTION

In view of the shortcomings of the prior art as summarized above, an object of the invention is to provide charged-particle-beam (CPB) microlithography apparatus and methods in which reticle-pattern manufacturing errors within subfields (or specified groups of subfields) can be corrected efficiently during exposure of the subfields or groups of subfields. Hence, high-resolution, high-accuracy lithographic pattern transfer and exposure can be realized.

To such ends, and according to a first aspect of the invention, CPB microlithography apparatus are provided for transferring a pattern, defined on a segmented reticle in which the pattern is divided into multiple subfields each defining a respective portion of the pattern, to a sensitive substrate. An embodiment of such an apparatus comprises a substrate stage, a reticle stage, an illumination-optical system, a projection-optical system, and a main controller. The substrate stage is configured to hold the substrate. The reticle stage is situated upstream of the substrate stage and configured to hold the reticle. The illumination-optical system is situated upstream of the reticle stage and configured to illuminate groups of subfields successively on the reticle using a charged-particle illumination beam, wherein each group consists of at least one respective subfield. The projection-optical system is situated between the reticle stage and the substrate stage. The projection-optical system is configured to direct an imaging beam, formed from particles of the illumination beam passing through the reticle, to the substrate such that respective images of the illuminated subfields are formed at respective positions on the substrate serving to stitch the images together. The main controller is connected to the reticle stage, substrate stage, illumination-optical system, and projection-optical system. The main controller is configured to command one or both the illumination-optical system and the projection-optical system to perform a respective optical correction as each subfield is being exposed. The optical correction is based on respective reticle-pattern-inspection data for each of the subfields. With respect to this embodiment, the optical correction can be, for example, one or more of shape-astigmatic aberration, focusing-astigmatic aberration, image focal point, image rotation, image magnification, and image position on the substrate. The optical correction can be made according to one or more respective correction values. The correction values can be determined by actual measurement data of the pattern as defined on the reticle and/or by optical simulation. The correction values can include one or more apparatus constants such as beam-acceleration voltage, beam-current density, beam-divergence angle, and optical-system length.

Another apparatus embodiment comprises the substrate stage, reticle stage, illumination-optical system, and projection-optical system as summarized above. This embodiment also includes a main controller connected to the reticle stage, substrate stage, illumination-optical system, and projection-optical system. The main controller comprises a memory in which are stored index data for various subfields based on respective reticle-pattern-inspection data for the subfields. Also stored in the memory are optical-correction data for the various subfields corresponding to the reticle-pattern-inspection data. The index data and corresponding optical-correction data desirably are stored as a look-up table that is consulted as each of the various subfields is being exposed so that exposure of each of the various subfields is corrected optically according to the recalled respective optical-correction data.

According to another aspect of the invention, methods are provided for performing CPB microlithography of a pattern to a sensitive substrate. In an embodiment of such a method, the pattern is defined on a segmented reticle in which the pattern is divided into multiple subfields each defining a respective portion of the pattern. Groups of subfields on the reticle (each group consisting of at least one respective subfield) are illuminated successively using a charged-particle illumination beam. As each group of subfields is illuminated, an imaging beam, formed from particles of the illumination beam passing through the reticle, is directed to the substrate such that respective images of the illuminated subfields are formed at respective positions on the substrate serving to stitch the images together. As each subfield is exposed, a respective optical correction is performed that is based on respective reticle-pattern-inspection data for each of the subfields. In this method, the optical correction can be one or more of shape-astigmatic aberration, focusing-astigmatic aberration, image focal point, image rotation, image magnification, and image position on the substrate. The optical correction can be made according to one or more respective correction values. The correction values can be determined by actual measurement data of the pattern as defined on the reticle and/or by optical simulation. The correction values can include one or more apparatus constants such as beam-acceleration voltage, beam-current density, beam-divergence angle, and optical-system length. The index data can be obtained from a previously performed reticle inspection made at the time of reticle fabrication. The index data can include one or more of image rotation and pattern-element positions within the respective subfields.

In another method embodiment, the pattern is defined on a segmented reticle as summarized above. Index data for various subfields are stored, based on respective reticle-pattern-inspection data for the subfields. Also stored are optical-correction data for the various subfields corresponding to the reticle-pattern-inspection data. These data desirably are stored as a look-up table. Groups of subfields on the reticle are illuminated successively using a charged-particle illumination beam, wherein each group consists of at least one respective subfield. As each group of subfields is illuminated, an imaging beam (formed from particles of the illumination beam passing through the reticle) is directed to the substrate such that respective images of the illuminated subfields are formed at respective positions on the substrate serving to stitch the images together. Also, as each of the various subfields is being exposed, the look-up table is consulted to obtain respective optical-correction data for the subfield. The optical-correction data are applied to optically correct exposure of each of the various subfields.

To improve the efficiency with which the correction values are obtained, correction indices (e.g., rankings or the like) can be determined from the pattern-element data within the respective subfields. Only these indices need be supplied as exposure data. At the same time, correction amounts corresponding to the indices are stored in the look-up table. During exposure of the respective subfields, correction amounts corresponding to the indices are recalled from the table, and corrections are performed in accordance with the data. The correction amounts in the table can be rewritten as desired, such as in accordance with changes in, e.g., beam-current density and beam-divergence angle. Furthermore, it is not necessary to store correction amounts for all correction ranks; intermediate values can be obtained by interpolation, thereby reducing the size of the table.

The foregoing and additional features and advantages of the invention will be more readily apparent from the following detailed description, which proceeds with reference to the accompanying drawings.

DETAILED DESCRIPTION

The invention is described below in the context of a representative embodiment. It will be understood, however, that the invention is not limited to that embodiment. Also, the invention is described below in the context of using an electron beam as a representative charged particle beam. It will be understood that the principles as applied to an electron beam can be applied with equal facility to use of an alternative charged particle beam, such as an ion beam.

Figure 1:
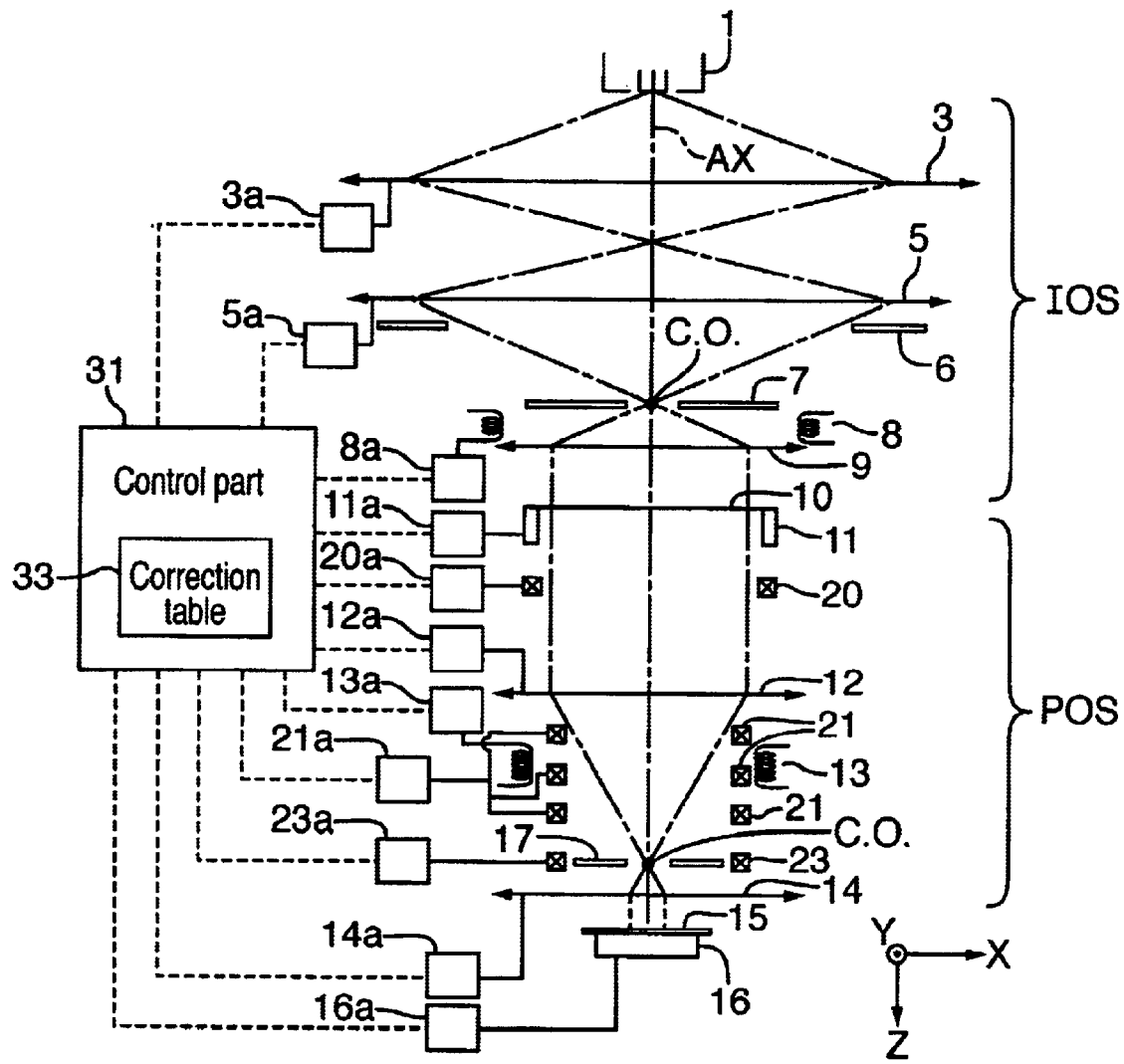
FIG. 1 is a schematic elevational diagram showing certain optical and control relationships of a charged-particle-beam (CPB) microlithography apparatus according to a representative embodiment of the invention.

FIG. 1 shows certain imaging and control relationships of an electron-beam microlithography apparatus according to the representative embodiment. The apparatus comprises an illumination-optical system IOS and a projection-optical system POS arranged along an optical axis AX. The illumination-optical system IOS comprises optical components situated between an electron gun 1 and a reticle 10, and the projection-optical system POS comprises optical components situated between the reticle 10 and a substrate 15. The reticle 10 defines the pattern to be transferred via the electron beam to the substrate 15. So as to be imprinted with the pattern as projected from the reticle by the projection-optical system POS, the upstream-facing surface of the substrate 15 is coated with a suitable "resist," thereby rendering the substrate "sensitive" to exposure by the electron beam. The substrate 15 can be any suitable material and configuration, such as a silicon wafer.

At the extreme upstream end of the apparatus, the electron gun 1 emits an electron beam ("illumination beam") in a downstream direction through the illumination-optical system IOS. The illumination-optical system comprises first and second condenser lenses 3, 5, respectively, a beam-shaping aperture 6, a blanking aperture 7, an illumination-beam deflector 8, and an illumination lens 9. The illumination beam from the electron gun 1 passes through the condenser lenses 3, 5, which converge the beam at a crossover C.O. situated at the blanking aperture 7.

The beam-shaping aperture 6 is situated downstream of the second condenser lens 5. The beam-shaping aperture has a profile (e.g., rectangular) that peripherally trims the illumination beam as the beam passes through the beam-shaping aperture. Thus, the illumination beam is trimmed to have a transverse profile that is shaped and dimensioned to illuminate a single exposure unit (e.g., a single subfield) on the reticle 10. For example, the beam-shaping aperture 6 trims the illumination beam to have a square transverse profile with side dimensions of slightly greater than 1 mm as incident on the reticle 10. A focused image of the beam-shaping aperture 6 is formed on the reticle 10 by the illumination lens 9.

As noted above, the blanking aperture 7 is situated downstream of the beam-shaping aperture 6 at a crossover C.O. The illumination-beam deflector 8 is installed beneath the same aperture 6. This deflector 8 mainly is situated and configured to scan the illumination beam in the X-direction in FIG. 1 so as to illuminate successive subfields on the reticle 10 in a sequential manner. The respective subfields that are illuminated per scan ("sweep") of the beam are in a respective row on the reticle located within the optical field of the illumination-optical system IOS. The illumination lens 9 is situated downstream of the illumination-beam deflector 8. The illumination lens 9 is a condenser lens that collimates the illumination beam for impingement on the reticle 10. Also, as noted above, the illumination lens 9 forms a focused image of the beam-shaping aperture 6 on the upstream-facing surface of the reticle 10.

In FIG. 1, only one subfield of the reticle 10 is shown, situated on the optical axis AX. In actuality, the reticle 10 comprises a large number of subfields, arrayed in the reticle plane extending in the X- and Y-directions (i.e., the X-Y plane). Typically, the reticle 10 defines the pattern for an entire layer of a microelectronic device (e.g., integrated circuit). The complete pattern normally extends sufficiently to occupy a "die" on the substrate 15, on which multiple dies typically are imprinted. A die occupies a space ultimately occupied by a respective "chip" on the substrate 15. To ensure that the illumination beam illuminates a particular subfield on the reticle 10, the illumination-beam deflector 8 is energized appropriately.

The reticle 10 is mounted on a reticle stage 11 that can be moved in the X- and Y-directions. Similarly, the substrate 15 is mounted on a substrate stage 16 that also is movable in the X- and Y-directions. During imaging of the pattern, the subfields residing in a particular row within the optical field of the illumination-optical and projection-optical systems are illuminated sequentially by scanning ("sweeping") the illumination beam in the X-direction (synchronously with scanning of the "imaging beam," propagating downstream of the reticle 10, in the X-direction). To progress from one row to the next, the reticle stage 11 and substrate stage 16 undergo respective continuous scanning motions in the Y-direction. Both stages 11, 16 are provided with respective position-measurement systems (typically laser interferometers, not shown but well understood in the art) that accurately measure the position of the respective stage in the respective X-Y plane. These accurate positional measurements are critical for achieving proper alignment and "stitching" together of subfield images as projected onto the substrate 15.

The projection-optical system POS comprises first and second projection lenses 12, 14, respectively, and a deflector 13 all situated downstream of the reticle 10. As the illumination beam is irradiated on a selected subfield of the reticle 10, portions of the beam are transmitted through the reticle while becoming imaged with the respective portion of the reticle pattern defined by the particular subfield. Hence, the beam propagating downstream of the reticle 10 is termed the "imaging beam" or "patterned beam." The patterned beam passes through the projection-optical system POS to the substrate 15. In this regard, as the patterned beam passes through the projection lenses, 12, 14, the image carried by the patterned beam is "demagnified," usually by an integer factor. Hence, the projection lenses 12, 14 collectively have a "demagnification ratio" such as ¼ or ⅕. The patterned beam is deflected by the deflector 13 and focused at a specified location on the substrate 15. Also, due to the optical behavior of the projection-optical system POS, the respective directions of sweeps of the illumination beam and imaging beam in the X-direction are mutually opposite, and the respective directions of motion of the stages in the Y-direction also are mutually opposite.

As noted above, the upstream-facing surface of the substrate 15 is coated with a suitable resist. Whenever a specified dose of the patterned beam impinges on the resist, the area of impingement is imprinted with the image carried by the patterned beam.

A crossover C.O. is situated on the axis AX at a point at which the axial distance between the reticle 10 and the substrate 15 is divided according to the demagnification ratio of the projection lenses 12, 14. A contrast aperture 17 is situated at the crossover. The contrast aperture 17 blocks portions of the patterned beam that experienced scattering upon passage through the reticle 10. Thus, the scattered electrons do not propagate to the substrate where they otherwise could degrade image contrast.

Each of the lenses 3, 5, 9, 12, 14 and each of the deflectors 8, 13 is connected to a respective driver 3a, 5a, 9a, 12a, 14a and 8a, 13a that supplies electrical power to the respective lens or deflector. Similarly, each of the stages 11, 16 is connected to a respective driver 11a, 16a that supplies electrical power to the respective stage 11, 16. Each of the drivers 3a, 5a, 8a, 9a, 11a, 12a, 13a, 14a, 16a is connected to a main controller 31 that generates and routes respective control signals for the drivers, thereby achieving controlled actuation of the lenses, deflectors, and stages. The main controller 31 also receives respective positional data from the respective position-measurement systems associated with the stages 11, 16.

The projection-optical system POS comprises a correction system in addition to the components described above. The correction system includes an "image-shape-astigmatism" (ISA)-correction device 20 situated immediately downstream of the reticle 10. The correction system also includes a "focusing-astigmatic-difference" (FAD)-correction device 23 situated at the same axial position as the contrast aperture 17. Each of the ISA- and FAD-correction devices 20, 23 desirably is configured as a respective astigmatism-correcting coil assembly termed a "stigmator." These stigmators 20, 23 correct image-shape astigmatism and focusing astigmatisms, respectively, of the images as projected onto the substrate 15.

The projection-optical system POS also comprises three air-core coils 21 situated between the first projection lens 12 and the contrast aperture 17. The coils 21 each desirably have a respective air coil and function as respective electromagnetic lenses that apply a correction to image focal point, image magnification and image rotation, respectively. These three image parameters can be corrected by appropriately selecting the excitation conditions of the three coils 21.

To facilitate making the proper imaging corrections, a correction table 33 is stored in a memory inside the main controller 31. The correction table 33 is used as a look-up table by the main controller 31. The correction table 33 lists correction data corresponding to the positions of pattern elements in each of the subfields, as determined previously from reticle-inspection data. In the table, the data have respective ranks (1~n). The correction data are obtained, for example, by actual measurements obtained as reference values and/or by optical simulations. To these data can be added apparatus variables and constants such as beam-acceleration voltage, beam-current density, beam-divergence angle, axial length of the CPB-optical system, etc. Optical simulations can be performed using commercially available electron-optical system-simulation software (e.g., software produced by Munro's Electron Beam Software, Ltd., England). The apparatus variables and constants can be selected and altered in the simulation. Next, with indices based on the respective distributions of pattern elements within the subfields being used as respective exposure data, correction indices for the respective subfields are calculated from CAD data for the pattern itself. This data is stored in the memory.

Meanwhile, errors in pattern-element position, generated during reticle fabrication, are measured using a reticle-inspection device. These data are added to the correction indices from the CAD data to yield corresponding exposure indices for each subfield.

According to the exposure data, the main controller 31 reads out the correction indices (ranks) for the electron-optical system for each of the respective subfields, and determines correction amounts corresponding to the ranks in the correction table 33. In this case, it is not necessary that the correction table 33 include correction amounts corresponding to all of the ranks. Intermediate correction amounts can be determined by interpolation. According to the respective correction amounts for each subfield as projected onto the substrate, aberrations of the subfield image are corrected by controlling the respective correction devices 20, 21, 23. To such end, the correction devices 20, 21, 23 are connected to the main controller 31 via respective drivers 20a, 21a, 23a.

Figure 3:
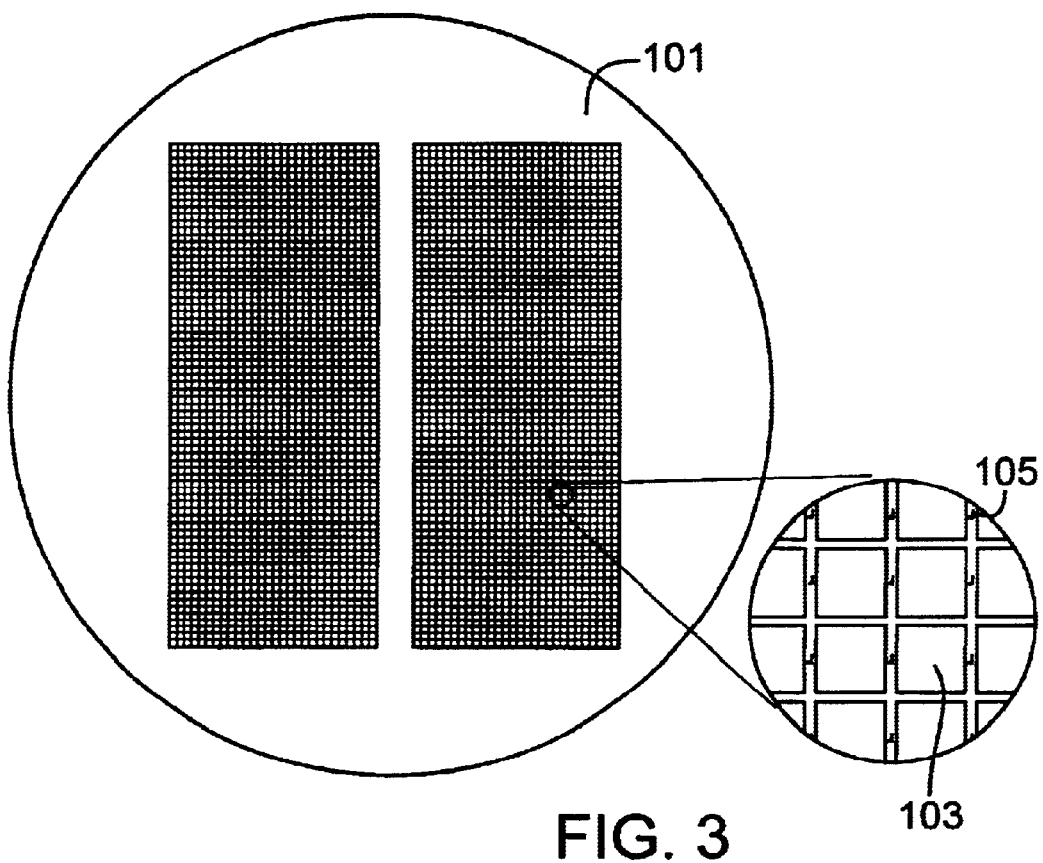
FIG. 3 is a plan view of a divided reticle, including marks as used for subfield-position measurements.

In a method for inspecting the reticle for pattern errors generated during fabrication of the reticle, marks 105 used for subfield-position measurements are provided between adjacent subfields 103 on the reticle 101, as shown for example in FIG. 3. In this example, the marks 105 are L-shaped to facilitate measurements of X-coordinates and Y-coordinates using a coordinate-measurement device (e.g., the Nikon model XY-5i). By providing these marks on the reticle at the same time the reticle is inscribed with the actual exposure pattern, and by performing subsequent reticle-manufacturing steps together with the exposure pattern, it is possible to obtain data on subfield-positional deviations as represented by these marks. The data thus obtained can be used as correction indices, allowing the respective position, magnification, and rotation of the images to be corrected at time of exposure.

Of course, reticle inspection is not limited to the use of marks located between subfields. Correction indices also can be obtained by direct inspection of the pattern as defined on the reticle.

As noted above, the respective lenses 3, 5, 9, 12, 14 and the respective deflectors 8, 13 are controlled by the main controller 31 via respective drivers 3a, 5a, 9a, 12a, 14a, 8a, 13a. Similarly, the respective correction devices 20, 21, 23 are controlled by the main controller 31 via respective drivers 20a, 21a, 23a, and the reticle stage 11 and wafer stage 16 are controlled by the main controller 31 via respective stage drivers 11a, 16a. As respective subfields on the reticle 10 are successively illuminated by the illumination beam, images of the subfields are projected onto respective positions on the substrate 15 after making the various corrections discussed above. Hence, reduced images of the subfields are accurately stitched together on the substrate to form a complete reduced image of the entire pattern on the substrate.

Figure 2:
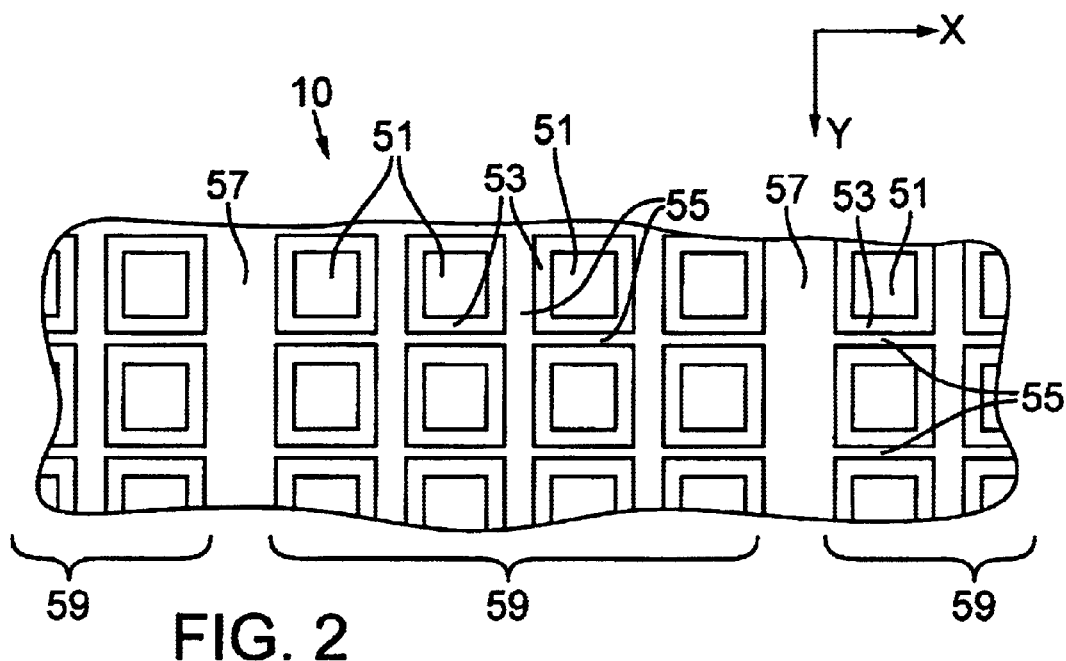
FIG. 2 is a plan view of a portion of a divided reticle as usable in the apparatus of FIG. 1.

An example of a divided reticle as used in electron-beam microlithography is shown in FIG. 2 (in plan view). The achievement of contrast in the image as exposed on the substrate 15 depends upon differential electron scattering and transmission by the reticle. Hence, to define the pattern, the reticle includes local regions that tend to scatter incident electrons at a relatively large scattering angle and other local regions that tend to transmit incident electrons with little to no scattering. Only an electron having a small scattering angle is transmitted by the contrast aperture 17 and focused onto the surface of the substrate 15.

There generally are two types of reticles 10. One type (termed a scattering-membrane reticle) comprises a relatively transmissive membrane, formed from silicon and having a thickness of approximately 0.1 $\mu$m, and a pattern of "scattering bodies" (made of a heavy metal) applied to the surface of the membrane to define the pattern elements. The other type (termed a scattering-stencil reticle) comprises a relatively scattering membrane, formed from silicon and having a thickness of approximately 2 $\mu$m, that defines a pattern of relatively transmissive through-holes to define the pattern elements. In the scattering-membrane reticle, the silicon membrane exhibits a relatively small scattering angle, while in the scattering-stencil reticle, the silicon membrane behaves as a scattering body that exhibits a relatively large scattering angle.

In FIG. 2, the squares 51 denote respective single subfields having dimensions of approximately 0.5-mm to 5-mm square on the reticle. The peripheral zone 53 in each subfield 51 is a respective skirt. The skirts 53 serve to trim the electron beam escaping from the subfield areas 51 through the reticle, and are formed from a scattering body having a large scattering angle. The width of each skirt 53 is approximately 10 to 100 $\mu$m. The remaining intervening structures 55 are support struts that form an intersecting lattice of structural members (known as grillage) that surround the skirts 53. The struts 55 collectively provide substantial rigidity and strength to the reticle. Each strut 55 has a thickness (in the Z-direction) of approximately 0.5 to 1 mm, and a width (in the X- or Y-direction) of approximately 100 $\mu$m.

In FIG. 2, four subfields 51 are lined up in the X-direction to form a single row of subfields. (Actually, the number of subfields in each row is greater than four.) A rectilinear array (in the Y-direction) of multiple rows constitutes a "stripe" 59. Multiple stripes 59 typically are arrayed (in the X-direction) to form the reticle pattern. Between adjacent stripes 59 is a relatively wide strut 57 that serves to prevent or substantially reduce reticle flexing. Each wide strut 57 typically has a width of several millimeters. The width of each stripe 59 corresponds to the width of the optical field of the electron-optical system.

During projection-transfer of the reticle pattern to the substrate, non-patterned regions (skirts and struts) of the reticle are not projected onto the surface of the substrate. Instead, the respective images of the subfields 51 are stitched together in a contiguous manner over the entire die. Assuming a demagnification ratio of $\frac{1}{4}$ or $\frac{1}{5}$, for example, the size of a single die on the substrate is about 27 mm×44 mm for a 4-gigabit DRAM. Accordingly, the overall size of the pattern on the reticle (including non-patterned skirts and struts) is approximately 120~230 mm×150~350 mm.

As can be understood from the foregoing description, correction indices (ranks and the like) are determined from the pattern data, with the respective subfields being considered in order to increase the efficiency of obtaining the optical-correction values for the subfields. These indices are supplied as exposure data. Correction amounts corresponding to the indices are stored as the look-up table 33 in a memory inside the microlithography apparatus. At the time of exposing the respective subfields, the correction amounts corresponding to the indices are read out from the table 33, and the respective corrections are performed. The correction amounts in the table 33 can be rewritten as required, such as in accordance with the prevailing beam-current density and beam-divergence angle, etc. It is not necessary to store correction amounts corresponding to all of the correction ranks in the memory. Intermediate values can be obtained by interpolation, thereby reducing the size of the table that must be stored.

Thus, divided-reticle CPB microlithography methods and apparatus are provided that allow efficient corrections of exposure conditions arising from reticle-manufacturing errors and from differences in the distribution of pattern elements in the respective subfields. This, in turn, provides high-resolution, high-accuracy pattern transfer and exposure.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam microlithography apparatus for transferring a pattern, defined on a segmented reticle in which the pattern is divided into multiple subfields each defining a respective portion of the pattern, to a sensitive substrate, the apparatus comprising:

a substrate stage configured to hold the substrate;

a reticle stage situated upstream of the substrate stage and configured to hold the reticle;

an illumination-optical system situated upstream of the reticle stage and configured to successively illuminate groups of subfields on the reticle using a charged-particle illumination beam, each group consisting of at least one respective subfield;

a projection-optical system situated between the reticle stage and the substrate stage, the projection-optical system being configured to direct an imaging beam, formed from particles of the illumination beam passing through the reticle, to the substrate such that respective images of the illuminated subfields are formed at respective positions on the substrate serving to stitch the images together; and a main controller connected to the reticle stage, substrate stage, illumination-optical system, and projection-optical system, the main controller being configured to command one or both the illumination-optical system and the projection-optical system to perform a respective optical correction as each subfield is being exposed, the optical correction being based on respective reticle-pattern-inspection data for each of the subfields.

2. The apparatus of claim 1, wherein the optical correction is selected from a group consisting of shape-astigmatic aberration, focusing-astigmatic aberration, image focal point, image rotation, image magnification, and image position on the substrate.

3. The apparatus of claim 1, wherein the optical correction is made according to one or more respective correction values determined by actual measurement data of the pattern as defined on the reticle.

4. The apparatus of claim 3, wherein the correction values include one or more apparatus constants selected from a group consisting of beam-acceleration voltage, beam-current density, beam-divergence angle, and optical-system length.

5. A method for performing charged-particle-beam microlithography of a pattern to a sensitive substrate, the method comprising:

(a) defining the pattern on a segmented reticle in which the pattern is divided into multiple subfields each defining a respective portion of the pattern;

(b) successively illuminating groups of subfields on the reticle using a charged-particle illumination beam, each group consisting of at least one respective subfield;

(c) as each group of subfields is illuminated, directing an imaging beam, formed from particles of the illumination beam passing through the reticle, to the substrate such that respective images of the illuminated subfields are formed at respective positions on the substrate serving to stitch the images together; and (d) as each subfield is exposed, performing a respective optical correction that is based on respective reticle-pattern-inspection data for each of the subfields.

6. The method of claim 5, wherein the optical correction is selected from a group consisting of shape-astigmatic aberration, focusing-astigmatic aberration, image focal point, image rotation, image magnification, and image position on the substrate.

7. The method of claim 5, wherein the optical correction is made according to one or more respective correction values determined by actual measurement data of the pattern as defined on the reticle.

8. The method of claim 7, wherein the correction values include one or more apparatus constants selected from a group consisting of beam-acceleration voltage, beam-current density, beam-divergence angle, and optical-system length.

9. A charged-particle-beam microlithography apparatus for transferring a pattern, defined on a segmented reticle in which the pattern is divided into multiple subfields each defining a respective portion of the pattern, to a sensitive substrate, the apparatus comprising:

a substrate stage configured to hold the substrate;

a reticle stage situated upstream of the substrate stage and configured to hold the substrate;

an illumination-optical system situated upstream of the reticle stage and configured to successively illuminate groups of subfields on the reticle using a charged-particle illumination beam, each group consisting of at least one respective subfield;

a projection-optical system situated between the reticle stage and the substrate stage, the projection-optical system being configured to direct an imaging beam, formed from particles of the illumination beam passing through the reticle, to the substrate such that respective images of the illuminated subfields are formed at respective positions on the substrate in a manner serving to stitch the images together; and a main controller connected to the reticle stage, substrate stage, illumination-optical system, and projection-optical system, the main controller comprising a memory in which are stored index data for various subfields based on respective reticle-pattern-inspection data for the subfields, and optical-correction data for the various subfields corresponding to the reticle-pattern-inspection data, the index data and corresponding optical-correction data being stored as a look-up table that is consulted as each of the various subfields is being exposed so that exposure of each of the various subfields is optically corrected according to the recalled respective optical-correction data.

10. The apparatus of claim 9, wherein the optical correction is selected from a group consisting of shape-astigmatic aberration, focusing-astigmatic aberration, image focal point, image rotation, image magnification, and image position on the substrate.

11. The apparatus of claim 9, wherein the optical correction is made according to one or more respective correction values determined by actual measurement data of the pattern as defined on the reticle.

12. The apparatus of claim 11, wherein the correction values include one or more apparatus constants selected from a group consisting of beam-acceleration voltage, beam-current density, beam-divergence angle, and optical-system length.

13. The method of claim 9, wherein the index data are obtained from a previously performed reticle inspection made at time of reticle fabrication, the index data including one or more of image rotation and pattern-element positions within the respective subfields.

14. A method for performing charged-particle-beam microlithography of a pattern to a sensitive substrate, the method comprising:

(a) defining the pattern on a segmented reticle in which the pattern is divided into multiple subfields each defining a respective portion of the pattern;

(b) storing index data for various subfields based on respective reticle-pattern-inspection data for the subfields, and optical-correction data for the various subfields corresponding to the reticle-pattern-inspection data, the index data and corresponding optical-correction data being stored as a look-up table;

(c) successively illuminating groups of subfields on the reticle using a charged-particle illumination beam, each group consisting of at least one respective subfield;

(d) as each group of subfields is illuminated, directing an imaging beam, formed from particles of the illumination beam passing through the reticle, to the substrate such that respective images of the illuminated subfields are formed at respective positions on the substrate serving to stitch the images together; and (e) as each of the various subfields is being exposed, consulting the look-up table to obtain respective optical-correction data for the subfield, and applying the optical-correction data to optically correct exposure of each of the various subfields.

15. The method of claim 14, wherein the index data are obtained from a previously performed reticle inspection made at time of reticle fabrication, the index data including one or more of image rotation and pattern-element positions within the respective subfields.

16. The method of claim 14, wherein the optical correction is selected from a group consisting of shape-astigmatic aberration, focusing-astigmatic aberration, image focal point, image rotation, image magnification, and image position on the substrate.

17. The method of claim 14, wherein the optical correction is made according to one or more respective correction values determined by actual measurement data of the pattern as defined on the reticle.

18. The method of claim 17, wherein the correction values include one or more apparatus constants selected from a group consisting of beam-acceleration voltage, beam-current density, beam-divergence angle, and optical-system length.

* * * * *